(12) United States Patent
Huang et al.

(10) Patent No.: US 11,682,684 B2
(45) Date of Patent: Jun. 20, 2023

(54) OPTICAL PACKAGE STRUCTURE

(71) Applicant: Advanced Semiconductor Engineering, Inc., Kaohsiung (TW)

(72) Inventors: Cheng-Ling Huang, Kaohsiung (TW); Lu-Ming Lai, Kaohsiung (TW); Ying-Chung Chen, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 210 days.

(21) Appl. No.: 17/066,412

(22) Filed: Oct. 8, 2020

(65) Prior Publication Data
US 2022/0115425 A1 Apr. 14, 2022

(51) Int. Cl.
*H01L 27/146* (2006.01)

(52) U.S. Cl.
CPC .. *H01L 27/14618* (2013.01); *H01L 27/14623* (2013.01); *H01L 27/14627* (2013.01); *H01L 27/14685* (2013.01)

(58) Field of Classification Search
CPC ......... H01L 27/14618; H01L 27/14623; H01L 27/14627; H01L 27/14685; H01L 27/14625; H04N 5/2253; H04N 5/2254; H04N 5/2257
See application file for complete search history.

(56) References Cited

U.S. PATENT DOCUMENTS

| | | | |
|---|---|---|---|
| 2016/0254397 A1* | 9/2016 | Senn | H02S 40/44 257/98 |
| 2021/0133420 A1* | 5/2021 | Xu | G06V 40/1318 |

* cited by examiner

*Primary Examiner* — Nelson Garces
(74) *Attorney, Agent, or Firm* — Foley & Lardner LLP

(57) ABSTRACT

An optical package structure and a method for manufacturing an optical package structure are provided. The optical package structure includes a sensor, an optical component and a fixing element. The optical component directly contacts the sensor. An interfacial area is defined by a contacting region of the optical component and the sensor. The fixing element is disposed outside of the interfacial area for bonding the optical component and the sensor.

15 Claims, 14 Drawing Sheets

OPTICAL PACKAGE STRUCTURE

BACKGROUND

1. Technical Field

The present disclosure relates generally to an optical package structure and a method for manufacturing an optical package structure.

2. Description of the Related Art

Along with the increasing technical advance of optical device packages, various structures are developed, and the package sizes are decreased. A lens module is usually bonded to a sensor through an adhesive layer to form an optical package structure. However, the process of disposing the adhesive layer between the lens module and the sensor give rise to some reliability issues.

SUMMARY

In one or more embodiments, an optical package structure includes a sensor, an optical component and a fixing element. The optical component directly contacts the sensor. An interfacial area is defined by a contacting region of the optical component and the sensor. The fixing element is disposed outside of the interfacial area for bonding the optical component and the sensor.

In one or more embodiments, a method for manufacturing an optical package structure includes the following operations: providing an outer casing having at least a cavity and a recessed portion adjacent to the cavity; disposing an optical component in the cavity; disposing a fixing element on the recessed portion; and disposing a sensor on the optical component and directly contacting the fixing element to bond the sensor and the optical component together through the fixing element.

In one or more embodiments, a method for manufacturing an optical package structure includes the following operations: bonding an optical component to a sensor, wherein the optical component directly contacts the sensor, an interfacial area being defined by a contacting region of the optical component and the sensor; and disposing a fixing element outside of the interfacial area for bonding the optical component and the sensor.

BRIEF DESCRIPTION OF THE DRAWINGS

Aspects of the present disclosure are best understood from the following detailed description when read with the accompanying drawings. It is noted that various features may not be drawn to scale, and the dimensions of the various features may be arbitrarily increased or reduced for clarity of discussion.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1:
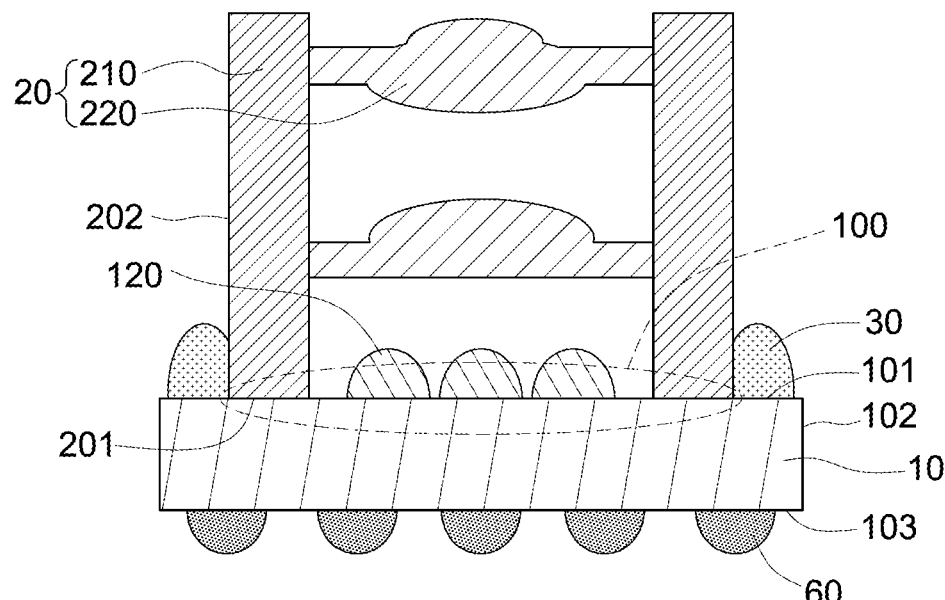
FIG. 1 illustrates a cross-sectional view of an optical package structure in accordance with some embodiments of the present disclosure.

FIG. 1 illustrates a cross-sectional view of an optical package structure 1 in accordance with some embodiments of the present disclosure. The optical package structure 1 includes a sensor 10, an optical component 20, a fixing element 30, and one or more conductive bumps 60.

The sensor 10 may be or include, but not limited to, a light-emitting device and/or a photodetector. The light-emitting device may be or include one or more light emitting diodes (LEDs), one or more laser diodes, or any combinations thereof. The photodetector may be or include one or more PIN diodes, photo-diodes, photo-transistors, or any combinations thereof. In some embodiments, the sensor 10 may be or include a CMOS image sensor. In some embodiments, the sensor 10 includes a surface 101 (also referred to as "an upper surface") and a surface 103 (also referred to as "a bottom surface") opposite to the surface 101. In some embodiments, the sensor 10 includes a lens array 120 on the surface 101. In some embodiments, the lens array 120 includes a micro-lens array. The lens array 120 may serve as condenser lens or focusing lens.

The optical component 20 directly contacts the sensor 10. In some embodiments, an interfacial area 100 (depicted in dotted lines) is defined by a contacting region of the optical component 20 and the sensor 10. In some embodiments, the optical component 20 is disposed on the surface 101 of the sensor 10. In some embodiments, the optical component 20 includes a surface 201 (also referred to as "a bottom surface") and a surface 202 (also referred to as "a lateral surface") angled with the surface 201, and the surface 201 of the optical component 20 is in contact with a sensing surface (e.g., the surface 101) of the sensor 10. In some embodiments, the optical component 20 is spaced apart from the lens array 120 of the sensor 10.

In some embodiments, the optical component 20 includes a housing 210 and a lens module 220, and the housing 210 surrounds the lens module 220. In some embodiments, the lens module 220 includes one or more lenses, including one or more concave lenses, one or more convex lenses, or any combinations thereof. In some embodiments, a bottom surface (e.g., the surface 201) of the optical component 20 directly contacts the upper surface (e.g., the surface 101) of the sensor 10. In some embodiments, the housing 210 may be composed of a material that is substantially opaque to a peak wavelength emitted or to be received by the sensor 10. In some embodiments, the lens array 120 of the sensor 10 is spaced apart from the housing 210. In some embodiments, the lens array 120 of the sensor 10 is spaced apart from the lens module 220. Accordingly, the lens array 120 is prevented from being damaged by the optical component 20.

The fixing element 30 is disposed outside of the interfacial area 100 for bonding the optical component 20 and the sensor 10. In some embodiments, the fixing element 30 directly contacts the surface 101 (also referred to as "the upper surface") of the sensor 10. In some embodiments, the fixing element 30 directly contacts the surface 202 (also referred to as "the lateral surface") of the optical component 20. In some embodiments, the fixing element 30 directly contacts the housing 210 of the optical component 20. In some embodiments, the fixing element 30 may be composed of a material that is substantially opaque to a peak wavelength emitted or to be received by the sensor 10. The fixing element 30 may include a resin optionally having fillers, a black gel optionally having fillers, an adhesive compound, or any combinations thereof.

In the cases where the optical component 20 is bonded to the sensor 10 through an adhesive layer formed therebetween, since it is relatively difficult to control the dispensing amount of the gel composition of the adhesive layer in the manufacturing process, the gel composition of the adhesive layer may overflow to the sensing region of the sensor 10, and it can adversely affect the performance of the optical package structure. In addition, since the adhesive layer is formed of a gel composition subjected to a curing process, the thickness of the adhesive layer may be non-uniform after the curing process even if a uniform thickness profile is provided prior to the curing process. The non-uniform thickness of the cured adhesive layer can render the central axis of the optical component 20 misaligned to the central axis of the sensor 10, and it can also adversely affect the performance of the optical package structure.

According to some embodiments of the present disclosure, the optical component 20 and the sensor 10 are bonded through the fixing element 30 outside of a projection area of the optical component 20. Alternatively, the optical package structure 1 is structured without any adhesive layer between the optical component 20 and the sensor 10 along the vertical direction so that the thickness profile of the adhesive layer does not affect the alignment of the optical component 20 and the sensor 10. As a result, the sensing region of the sensor 10 can be free from contamination, the misalignment of central axes of the optical component 20 and the sensor 10 which could have been caused by an intervening adhesive layer can be prevented, and thus the performance of the optical package structure 1 can be improved.

In addition, according to some embodiments of the present disclosure, the fixing element 30 is disposed outside of the interfacial area 100 between the optical component 20 and the sensor 10 and is composed of a material that is substantially opaque to a peak wavelength emitted or to be received by the sensor 10; therefore, the light interference from adjacent optical components 20 can be reduced.

The conductive bumps 60 are disposed on the surface 103 (also referred to as "the bottom surface") of the sensor 10. In some embodiments, each of the conductive bumps 60 may be or include a solder bump. In some embodiments, each of the conductive bumps 60 may be or include gold (Au), silver (Ag), copper (Cu), another metal, a solder alloy, or a combination of two or more thereof.

Figure 2:
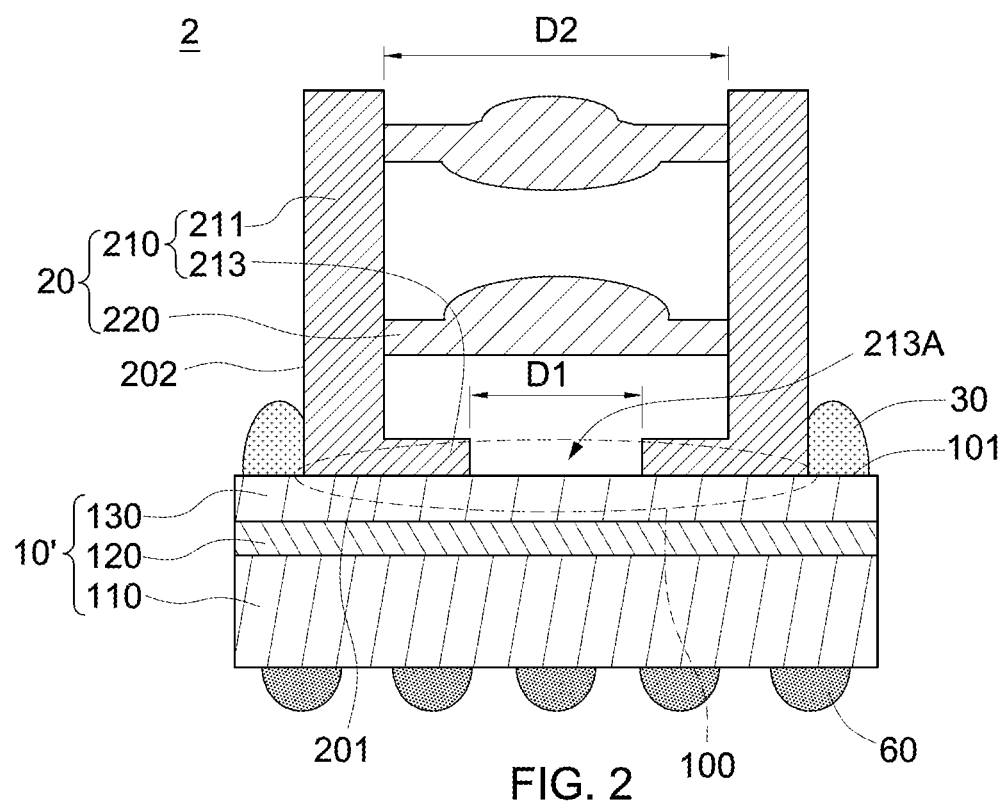
FIG. 2 illustrates a cross-sectional view of an optical package structure in accordance with some embodiments of the present disclosure.

FIG. 2 illustrates a cross-sectional view of an optical package structure 2 in accordance with some embodiments of the present disclosure. The optical package structure 2 is similar to the optical package structure 1 in FIG. 1 except that, for example, the sensor 10' of the optical package structure 2 further includes a protection layer 130.

The protection layer 130 covers the lens array 120. Accordingly, the lens array 120 is prevented from being damaged by external components. In some embodiments, the protection layer 130 directly contacts the lens array 120. In some embodiments, the sensor 10' includes a sensor layer 110, a lens array 120, and a protection layer 130. In some embodiments, the lens array 120 is between the sensor layer 110 and the protection layer 130. In some embodiments, the protection layer 130 is spaced apart from the lens module 220 of the optical component 20. In some embodiments, the protection layer 130 may be composed of a material that is substantially transparent to a peak wavelength emitted or to be received by the sensor 10. In some embodiments, the protection layer 130 includes a glass layer.

In some embodiments, the housing 210 of the optical component 20 includes a wall portion 211 and a bottom portion 213 connected to the wall portion 211. In some embodiments, the wall portion 211 is angled with the bottom portion 213. In some embodiments, the bottom portion 213 defines a light-transmitting area 213A for the sensor 10' to receive lights passing through the lens module 220. In some embodiments, a diameter D1 of the light-transmitting area 213A is smaller than a diameter D2 of the lens of the lens module 220. According to some embodiments of the present disclosure, the design of the light-transmitting area 213A defined by the bottom portion 213 of the housing 210 is advantageous to the convergence of received lights and blocking noise from entering the sensor 10'.

Figure 3:
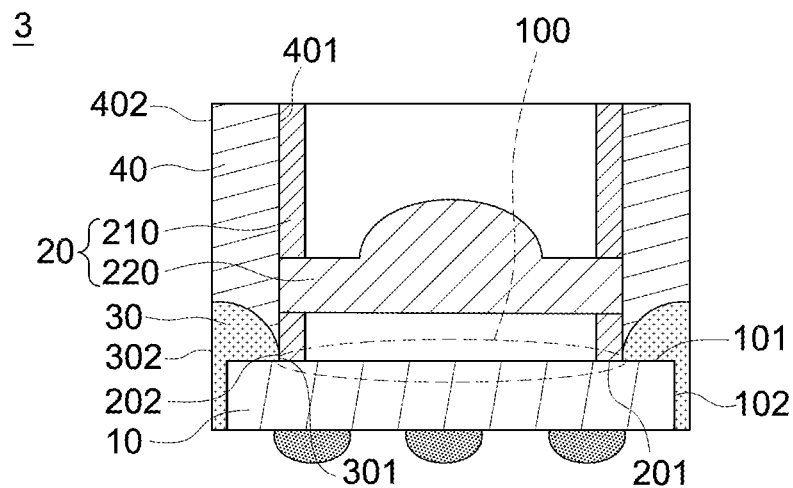
FIG. 3 illustrates a cross-sectional view of an optical package structure in accordance with some embodiments of the present disclosure.

FIG. 3 illustrates a cross-sectional view of an optical package structure 3 in accordance with some embodiments of the present disclosure. The optical package structure 3 is similar to the optical package structure 1 in FIG. 1 except that, for example, the optical package structure 3 further includes a blocking layer 40.

The blocking layer 40 surrounds the optical component 20. In some embodiments, the blocking layer 40 directly contacts the lateral surface (e.g., the surface 202) of the optical component 20. In some embodiments, the blocking layer 40 directly contacts the housing 210 of the optical component 20. In some embodiments, the blocking layer 40 directly contacts the fixing element 30. In some embodiments, the blocking layer 40 is substantially opaque to a peak wavelength emitted or to be received by the sensor 10. In some embodiments, the blocking layer 40 may be composed of a material that is substantially opaque to a peak wavelength emitted or to be received by the sensor 10. The blocking layer 40 may include a resin optionally having fillers, a black gel optionally having fillers, an adhesive compound, or any combinations thereof. According to some embodiments of the present disclosure, light interference between adjacent optical components 20 can be effectively prevented by the blocking layer 40 surrounding the optical component 20.

In some embodiments, the housing 210 may be substantially transparent or opaque to a peak wavelength emitted or to be received by the sensor 10. In some embodiments, a portion of the lens module 220 may be exposed from the housing 210, and the blocking layer 40 covers the exposed portion of the lens module 220. According to some embodiments of the present disclosure, the blocking layer 40 can prevent light having a peak wavelength emitted or to be received by the sensor 10 from entering the optical component 20.

The fixing element 30 may have a surface 301 directly contacting the optical component 20 and a surface 302 opposite to the surface 301. The blocking layer 40 may have a surface 401 directly contacting the optical component 20 and a surface 402 opposite to the surface 401. In some embodiments, the surface 302 of the fixing element 30 is substantially coplanar with the surface 402 of the blocking layer 40.

In some embodiments, the sensor 10 further includes a surface 102 (also referred to as "a lateral surface") angled with the surface 101. In some embodiments, the fixing element 30 directly contacts the surface 102 of the sensor 10. In some embodiments, the fixing element 30 fully covers the surface 102 of the sensor 10. In some embodiments, the fixing element 30 directly contacts a portion of the lateral surface (e.g., the surface 202) of the optical component 20.

Figure 4:
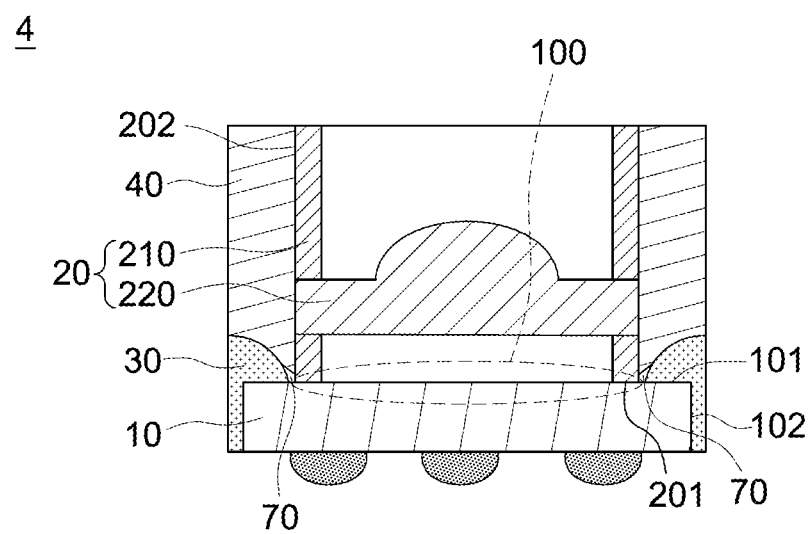
FIG. 4 illustrates a cross-sectional view of an optical package structure in accordance with some embodiments of the present disclosure.

FIG. 4 illustrates a cross-sectional view of an optical package structure 4 in accordance with some embodiments of the present disclosure. The optical package structure 4 is similar to the optical package structure 3 in FIG. 3 except that, for example, the arrangement of the fixing element 30 and the blocking layer 40 is different.

In some embodiments, the fixing element 30 may be spaced apart from the optical component 20 by the blocking layer 40. According to some embodiments of the present disclosure, the fixing element 30 together with a portion of the blocking layer 40 serve to bond the optical component 20 and the sensor 10.

In some embodiments, a void 70 may be formed between the fixing element 30 and the optical component 20. In some embodiments, a portion of the surface 101 may be exposed to the void 70. In some embodiments, a portion of the lateral surface (e.g., the surface 202) of the optical component 20 may be exposed to the void 70. In some embodiments, the fixing element 30 may be spaced apart from the optical component 20 by the void 70.

Figure 5:
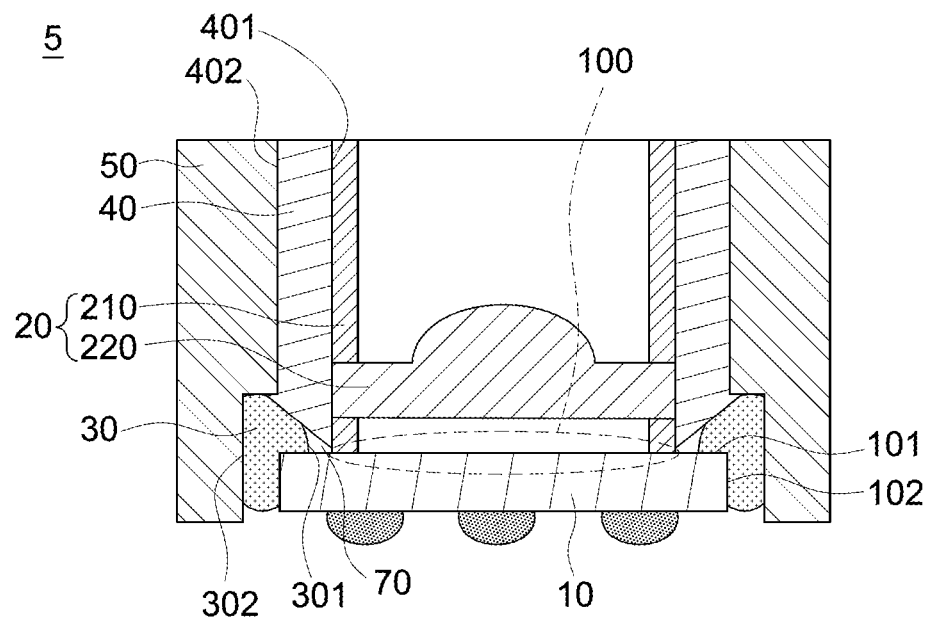
FIG. 5 illustrates a cross-sectional view of an optical package structure in accordance with some embodiments of the present disclosure.

FIG. 5 illustrates a cross-sectional view of an optical package structure 5 in accordance with some embodiments of the present disclosure. The optical package structure 5 is similar to the optical package structure 4 in FIG. 4 except that, for example, the optical package structure 5 further includes an outer casing 50.

In some embodiments, the outer casing 50 surrounds the optical component 20. In some embodiments, the outer casing 50 surrounds the fixing element 30. In some embodiments, the outer casing 50 directly contacts the fixing element 30. In some embodiments, the outer casing 50 surrounds the blocking layer 40. In some embodiments, the outer casing 50 directly contacts the blocking layer 40. In some embodiments, an inner surface of the outer casing 50 includes a step profile proximate to the interfacial area 100. In some embodiments, the step profile of the outer casing 50 is configured to accommodate the fixing element 30. In some embodiments, the outer casing 50 is composed of a material that is substantially opaque to a peak wavelength emitted or to be received by the sensor 10. In some embodiments, the outer casing 50 includes an epoxy resin having fillers, a molding compound (e.g., an epoxy molding compound or other molding compound), polyimide, a phenolic compound or material, a material with a silicone dispersed therein, or a combination thereof. In some embodiments, the outer casing 50 may be or include liquid crystal polymer (LCP).

Figure 5A:
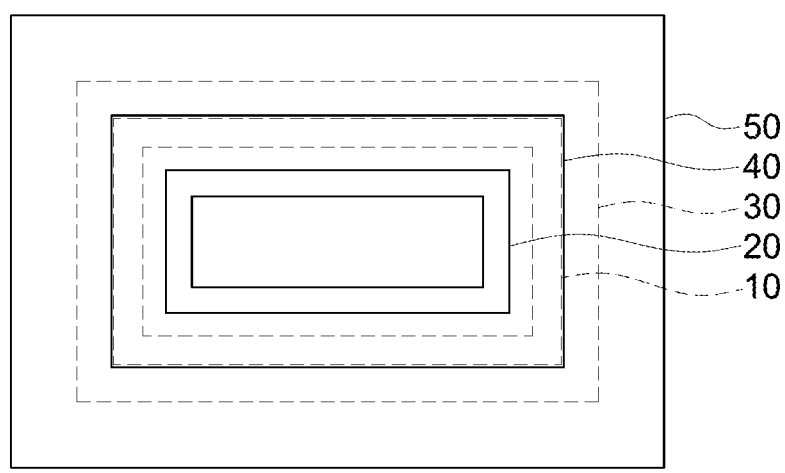
FIG. 5A illustrates a top view of an optical package structure in accordance with some embodiments of the present disclosure

FIG. 5A illustrates a top view of an optical package structure 5A in accordance with some embodiments of the present disclosure. In some embodiments, FIG. 5A may represent the top view of the structure shown in FIG. 5.

In some embodiments, the fixing element 30 surrounds a circumference of the optical component 20. In some embodiments, the outer casing 50 surrounds a circumference of the blocking layer 40. In some embodiments, the fixing element 30 and the blocking layer 40 partially overlap from a top view perspective.

Figure 6:
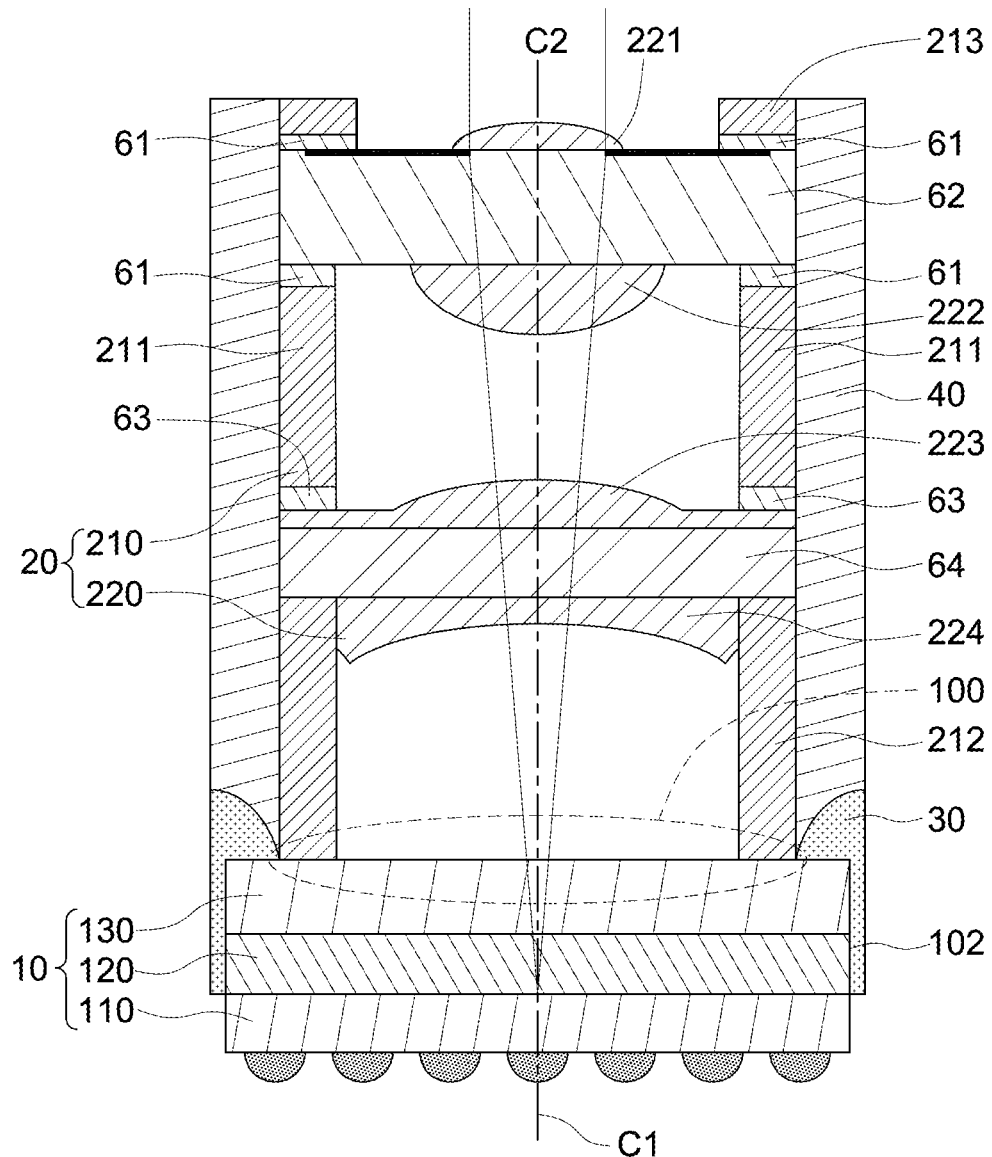
FIG. 6 illustrates a cross-sectional view of an optical package structure in accordance with some embodiments of the present disclosure.

FIG. 6 illustrates a cross-sectional view of an optical package structure 6 in accordance with some embodiments of the present disclosure. The optical package structure 6 is similar to the optical package structure 2 in FIG. 2 except that, for example, the detailed structures of the sensor 10 and the optical component 20 are different.

In some embodiments, the optical component 20 has a central axis C2 aligned with a central axis C1 of the sensor 10.

In some embodiments, the housing 210 of the optical component 20 includes a plurality of segments 211, 212 and 213, and the lens module 220 of the optical component 20 includes lenses 221, 222, 223 and 224. In some embodiments, the lenses 221 and 222 are disposed on two opposite sides of a lens wafer 62, and the lens wafer 62 is bonded to the segments 211 and 213 of the housing 210 through the bonding layers 61. In some embodiments, the lenses 223 and 224 are disposed on two opposite sides of a lens wafer 64, and the lens wafer 64 is bonded to the segments 211 of the housing 210 through the bonding layers 63. In some embodiments, the segments 212 of the housing 210 directly contact the lens wafer 64 and the sensor 10. In some embodiments, the segments 212 of the housing 210 of the optical component directly contact the protection layer 130 of the sensor 10.

Figure 7A:
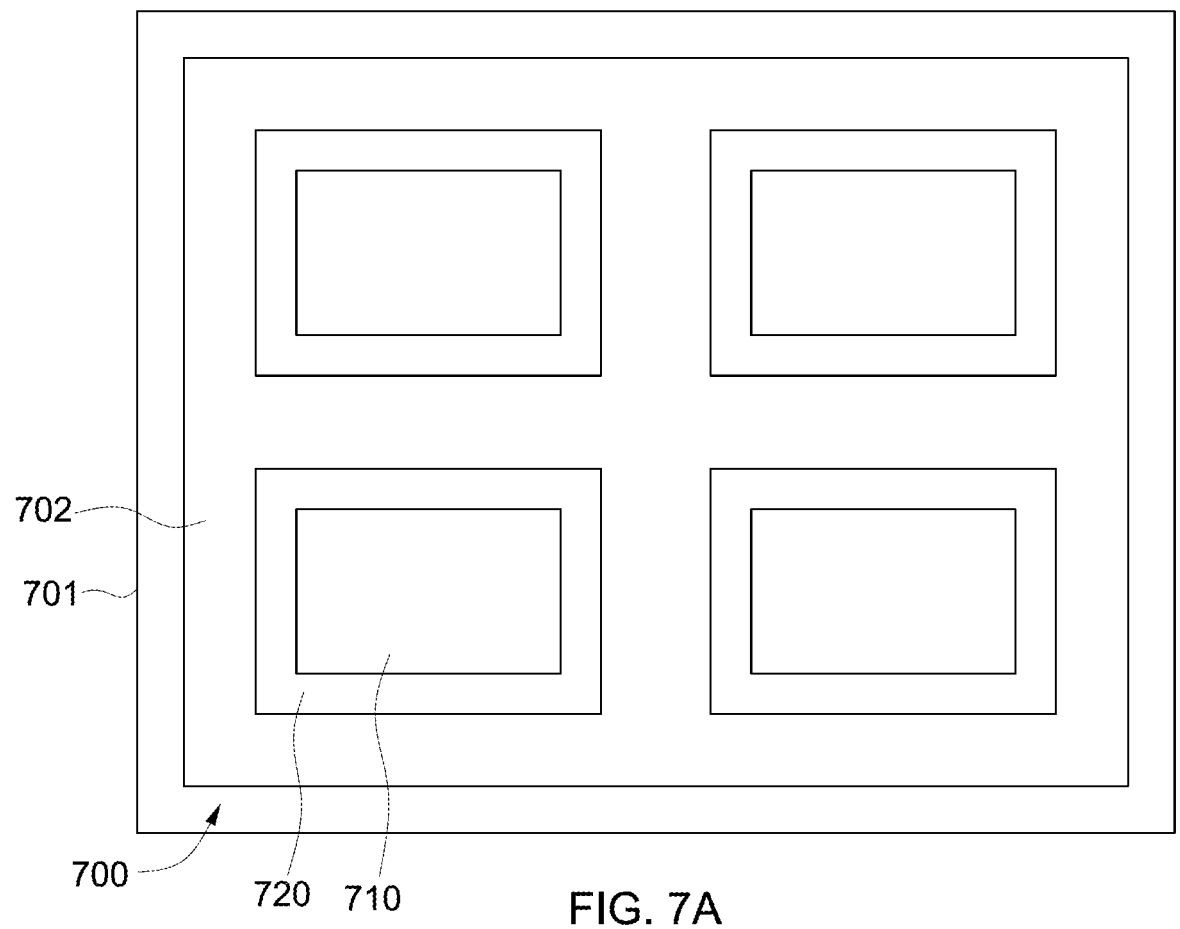
FIG. 7A, FIG. 7B, FIG. 8A, FIG. 8B, FIG. 9A, FIG. 9B, FIG. 10A, FIG. 10B, FIG. 11A and FIG. 11B illustrate various operations in a method of manufacturing an optical package structure in accordance with some embodiments of the present disclosure.
Figure 7B:
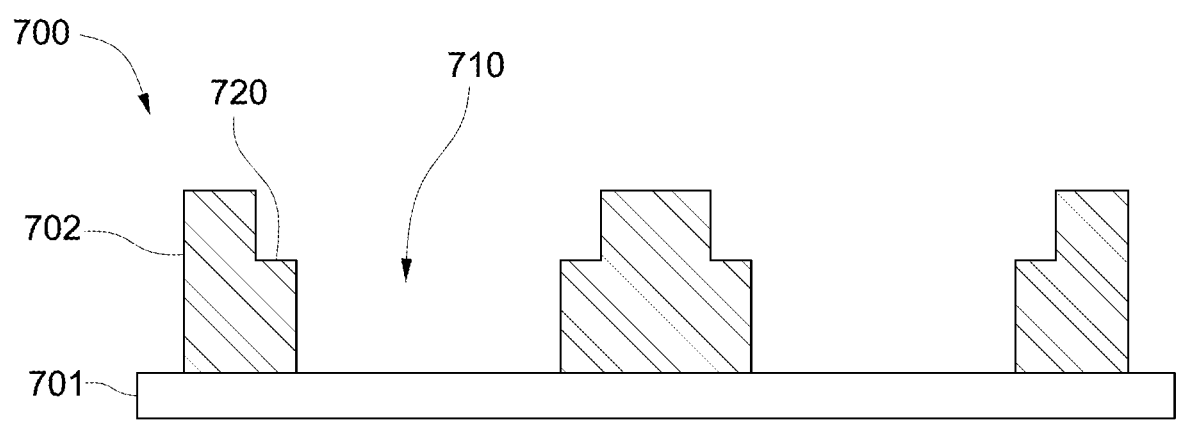
Figure 8A:
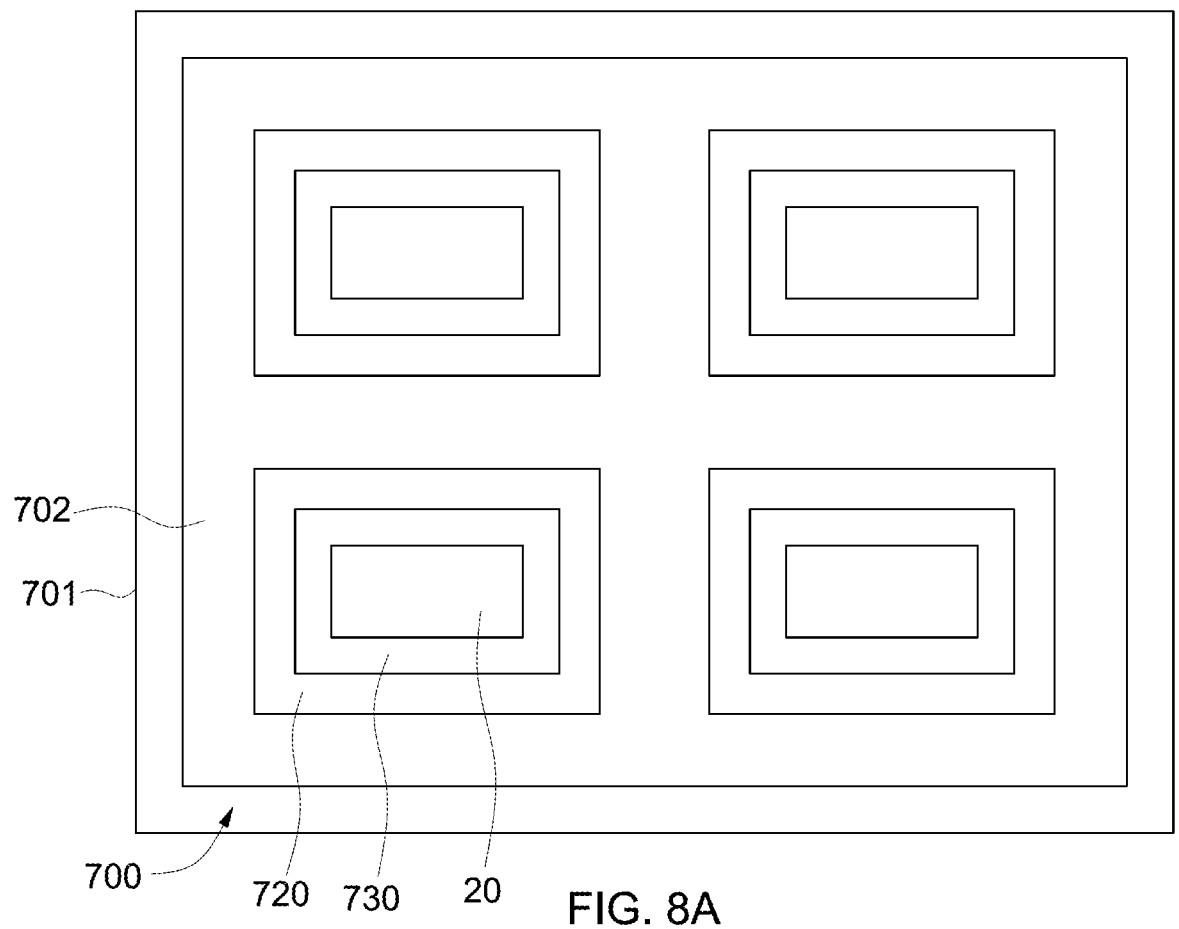
Figure 8B:
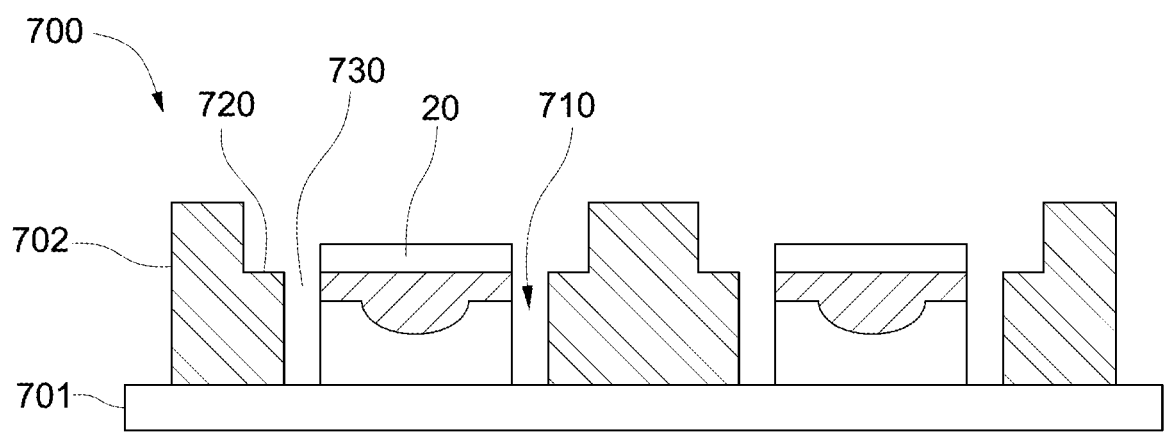
Figure 9A:
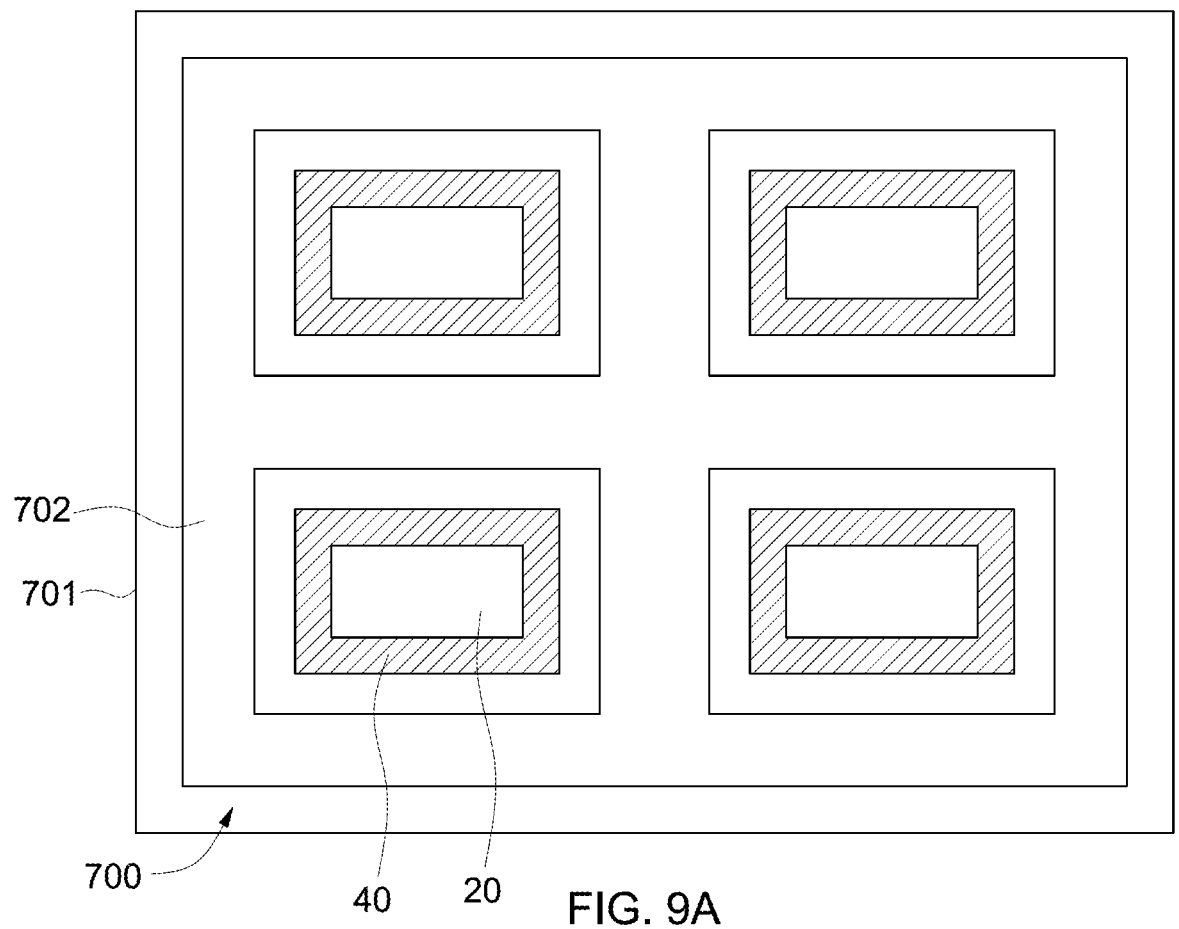
Figure 9B:
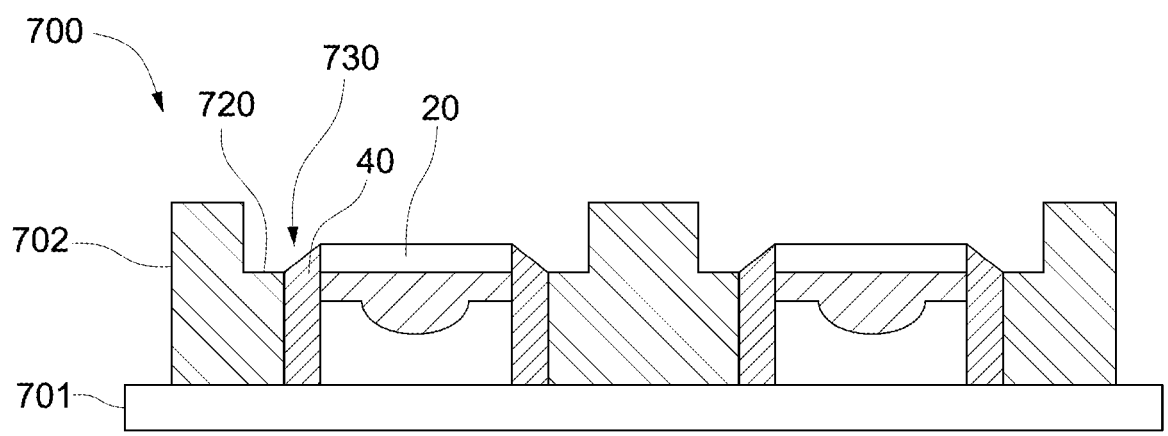
Figure 10A:
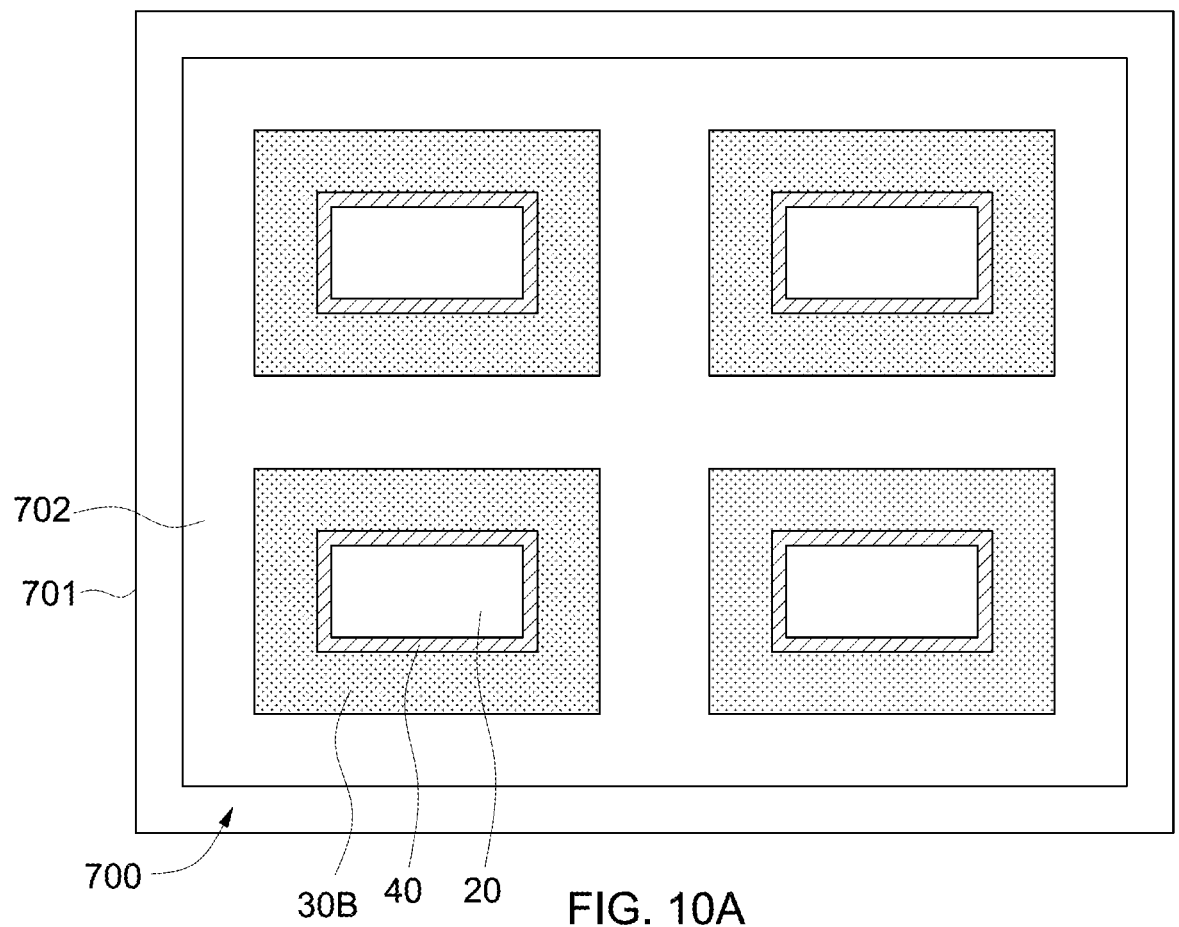
Figure 10B:
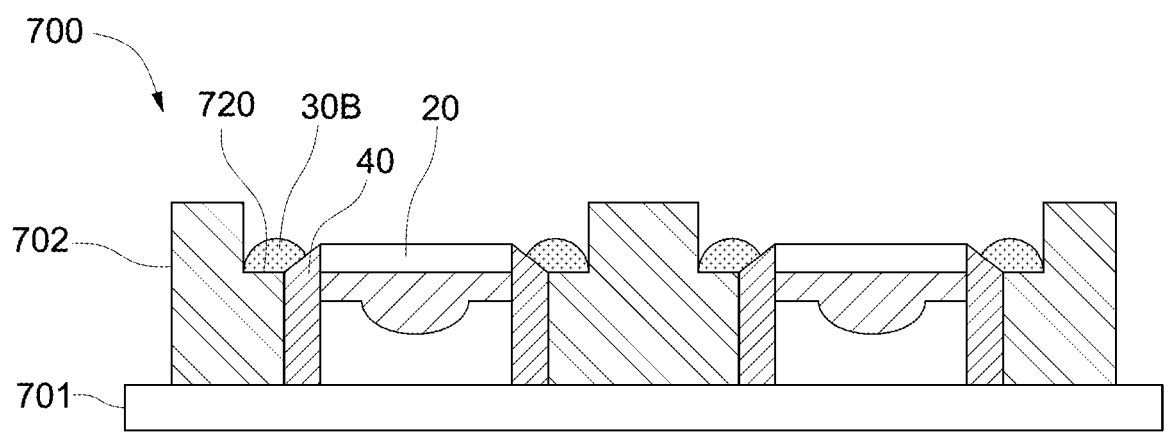
Figure 11A:
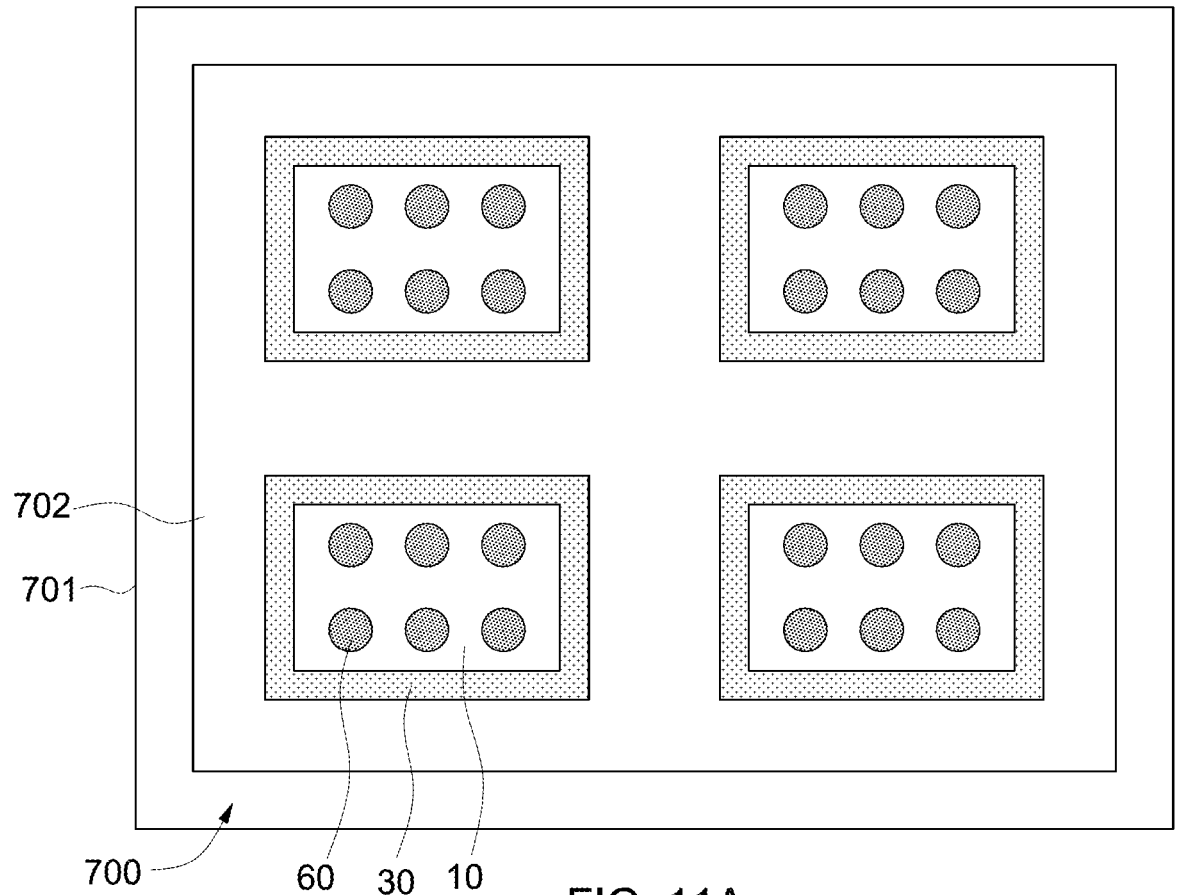

FIG. 7A, FIG. 7B, FIG. 8A, FIG. 8B, FIG. 9A, FIG. 9B, FIG. 10A, FIG. 10B, FIG. 11A and FIG. 11B illustrate various operations in a method of manufacturing an optical package structure in accordance with some embodiments of the present disclosure. In some embodiments, FIG. 7A illustrates a top view of the structure shown in FIG. 7B, FIG. 8A illustrates a top view of the structure shown in FIG. 8B, FIG. 9A illustrates a top view of the structure shown in FIG. 9B, FIG. 10A illustrates a top view of the structure shown in FIG. 10B, and FIG. 11A illustrates a top view of the structure shown in FIG. 11B.

Referring to FIGS. 7A-7B, an outer casing 700 is provided. In some embodiments, the outer casing 700 is placed on a support layer 701. In some embodiments, the outer casing 700 has at least a cavity 710 and a recessed portion 720 adjacent to the cavity 710. In some embodiments, the outer casing 700 has a plurality of cavities 710 and a plurality of recessed portions 720. In some embodiments, the outer casing 700 includes a wall structure 702 adhered to the support layer 701. In some embodiments, the wall structure 702 and the support layer 701 define the cavities 710. In some embodiments, the support layer 701 includes a releasing film or a tape. In some embodiments, the support layer 701 may be or include polyimide (PI). According to some embodiments of the present disclosure, the support layer 701 is or includes polyimide which is resistant to relatively high temperature processes, and thus the support layer 701 can be completely removed in subsequent processes without leaving residue on the optical package structure.

Referring to FIGS. 8A-8B, an optical component 20 is disposed in the cavity 710. In some embodiments, the outer casing 700 is placed on the support layer 701 prior to disposing the optical component 20 in the cavity 710. In some embodiments, a plurality of optical components 20 are disposed in the cavities 710. In some embodiments, the optical component 20 is spaced apart from the wall structure 720 so as to reserve a trench 730 therebetween. In some embodiments, a plurality of trenches 730 are formed between the optical components 20 and the wall structure 702 of the outer casing 700. In some embodiments, each of the trenches 730 surrounds each of the optical components 20.

Referring to FIGS. 9A-9B, a blocking layer 40 is formed in the trench 730. In some embodiments, the blocking layer 40 fills the space between the optical component 20 and the wall structure 702. In some embodiments, the operation of forming the blocking layer 40 may include the following steps: dispensing a first gel in the trench 730, and performing a first curing operation on the first gel in the trench 730. In some embodiments, the first gel is substantially opaque to a peak wavelength emitted or to be received by a sensor to be bonded to the optical component (e.g., the sensor 10). In some embodiments, the first curing operation is performed under a temperature lower than about 150° C. In some embodiments, the first curing operation is performed under a temperature equal to or lower than about 100° C.

Referring to FIGS. 10A-10B, a fixing element 30 is disposed on the recessed portion 720. In some embodiments, the optical component 20 is disposed on the support layer 701 prior to disposing the fixing element 30 on the recessed portion 720. In some embodiments, the operation of disposing the fixing element 30 on the recessed portion 720 may include the following steps: dispensing a second gel 30B on the recessed portion 720, and performing a second curing operation on the second gel 30B.

In some embodiments, the second gel 30B has a viscosity greater than that of the first gel for forming the blocking layer 40. Accordingly, the second gel 30B can preliminarily fix the sensor 10 at a relatively stable position corresponding to the optical component 20, which is advantageous to the alignment of the sensor 10 and the optical component 20.

In some embodiments, the second curing operation is performed under a temperature lower than about 150° C. In some embodiments, the second curing operation is performed under a temperature equal to or lower than about 100° C. According to some embodiments of the present disclosure, the curing operations are performed under a relatively low temperature, for example, equal to or lower than about 150° C., and thus the support layer 701 and/or other releasing films can be completely removed in subsequent processes without leaving residue on the optical package structure.

Figure 11B:
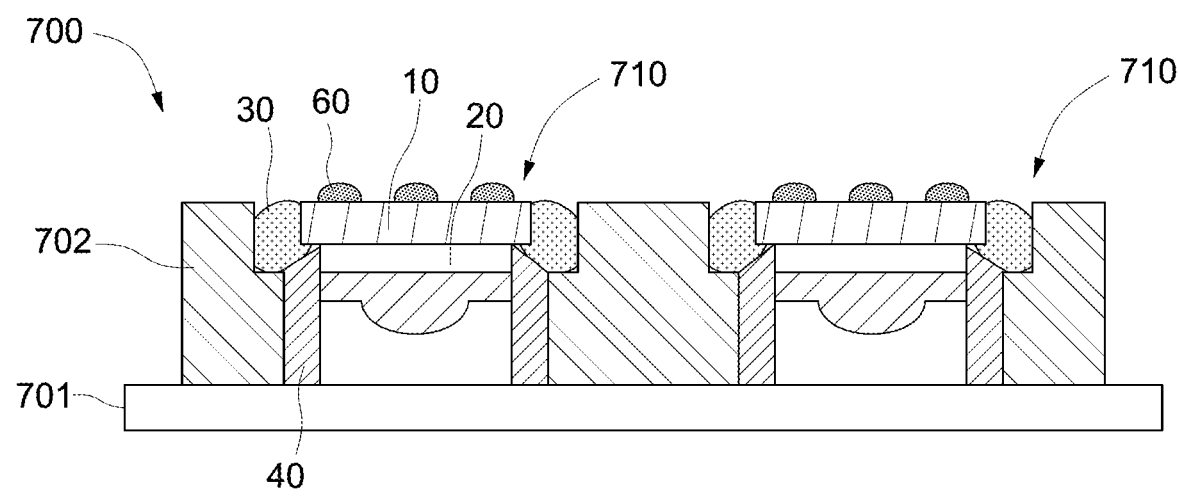

Referring to FIGS. 11A-11B, a sensor 10 is disposed on the optical component 20. In some embodiments, the sensor 10 directly contacts the fixing element 30 so as to bond the sensor 10 and the optical component 20 together through the fixing element 30. In some embodiments, the aforesaid second curing operation is performed on the second gel 30B after disposing the sensor 10 on the optical component 20.

In some embodiments, after the sensor 10 and the optical component 20 are bonded together through the fixing element 30, a singulation operation is performed for separating adjacent cavities of the outer casing 700. In some embodiments, the support layer 701 is removed from the optical component 20. In some embodiments, the support layer 701 may be removed prior to or after performing the singulation operation.

In some embodiments, please also refer to FIG. 5, the operation of performing the singulation operation includes removing a portion of the wall structure 702, so as to form the singulated optical package structure 5 shown in FIG. 5. In some embodiments, please also refer to FIG. 3 and/or FIG. 4, the operation of performing the singulation operation includes removing the wall structure 702 in its entirety, so as to form the singulated optical package structure 3 or 4 shown in FIG. 3 or FIG. 4. Depending on the width of the singulation blade, the singulated optical package structure 3 or 4 can be obtained with a wider blade, and the singulated optical package structure 5 can be obtained with a narrower blade.

In the cases where additional light-blocking layers are coated on exterior sidewalls of individual optical components 20 to prevent light interference between adjacent optical components 20, the upper surface (i.e., the surface where lights enter into the optical component 20) of the optical component 20 and the bottom surface (e.g., the surface 103) of the sensor 10 are required to be covered by tapes to protect them from being coated by the light-blocking layer. However, after the light-blocking layer is coated on the exterior sidewalls of individual optical components 20 and then the tape is removed, residue of the tape may remain on the upper surface of the optical component 20 and/or the bottom surface of the sensor 10, thereby the performance of the optical package structure may be adversely affected.

According to some embodiments of the present disclosure, the blocking layer 40 is formed in the trench 730 surrounding the optical component 20, and thus no tapes or other releasing films are required to cover the upper surface of the optical component 20 and/or the bottom surface of the sensor 10 when forming the blocking layer 40. Therefore, light interference between adjacent optical components 20 can be effectively prevented, and the performance of the optical package structure is not adversely affected by any undesired material residue.

In addition, according to some embodiments of the present disclosure, the upper surface of the blocking layer 40 and the recessed portion 720 of the outer casing 700 can serve as a receiving space for the gel composition of the fixing element 30 to be dispensed thereon. Therefore, the sensor 10 can be readily aligned to and disposed on the optical component 20 without applying additional adhesive layer to bond the sensor 10 to the optical component 20. Moreover, the gel composition can be limited within the recessed portion 720 without overflowing outside the outer casing 700, such that the structure and the dimension of the fixing element 30 can be limited to the defined range.

Figure 12A:
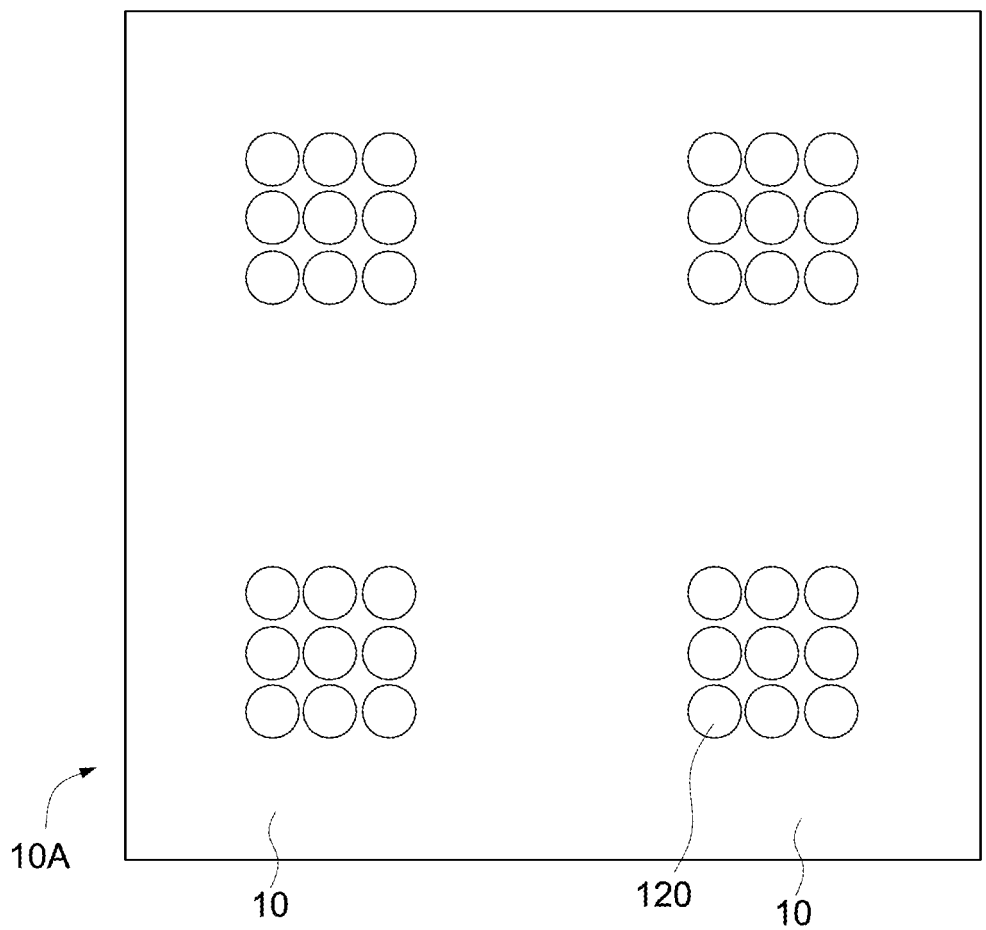
FIG. 12A, FIG. 12B, FIG. 13A, FIG. 13B, FIG. 14A, and FIG. 14B illustrate various operations in a method of manufacturing an optical package structure in accordance with some embodiments of the present disclosure.
Figure 12B:
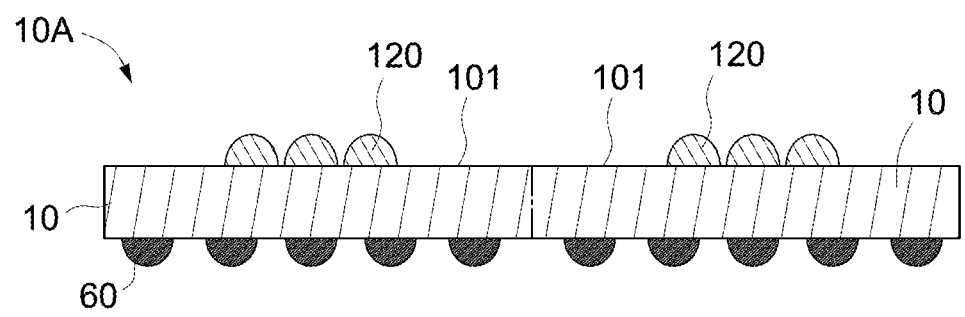
Figure 13A:
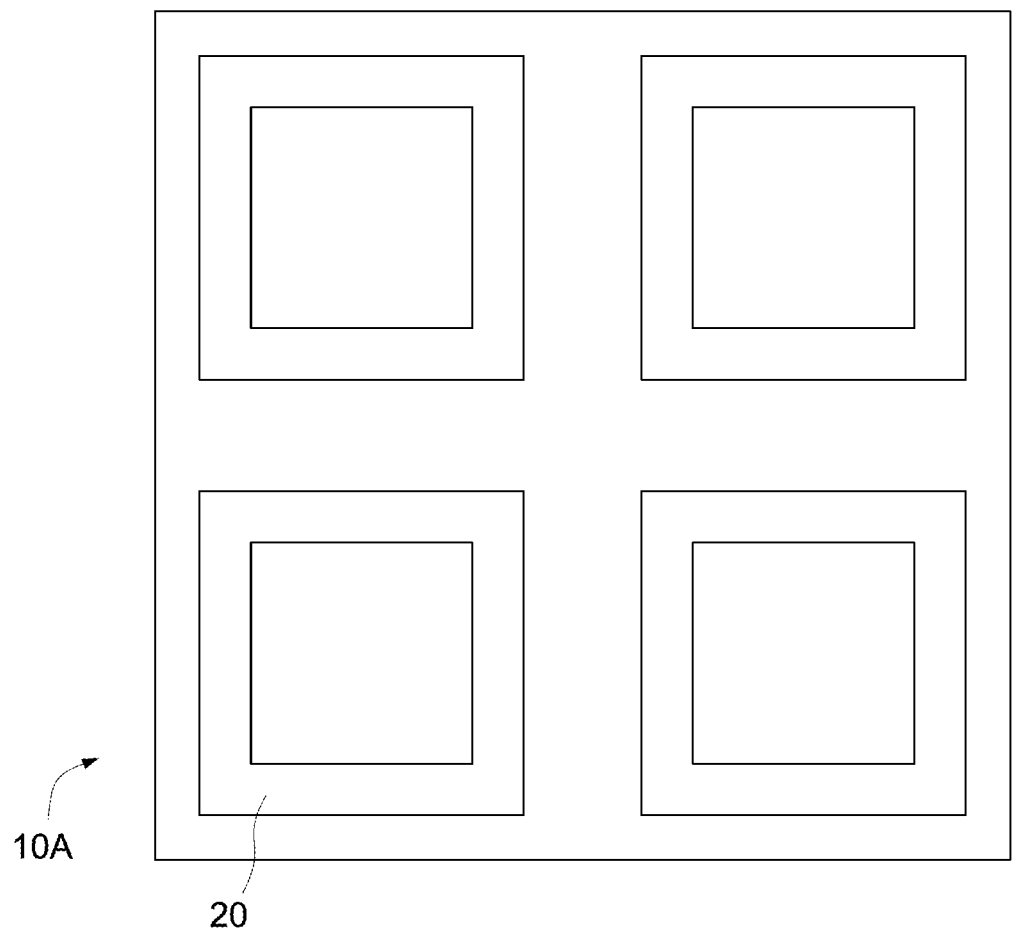
Figure 13B:
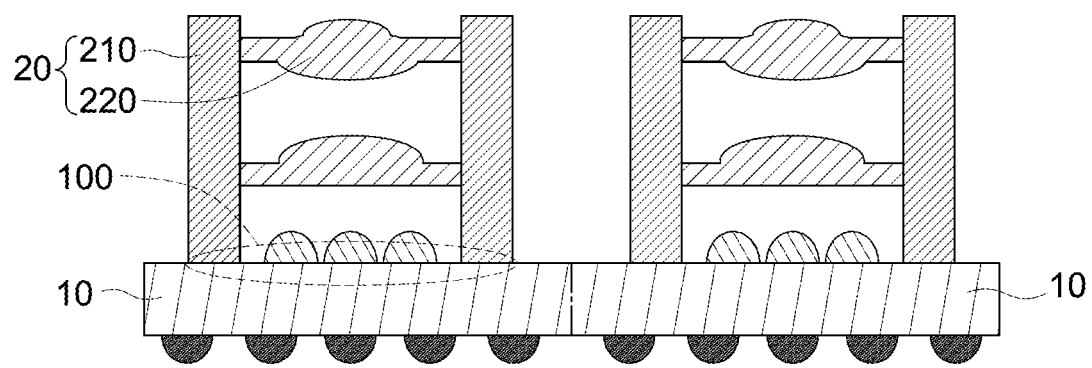
Figure 14A:
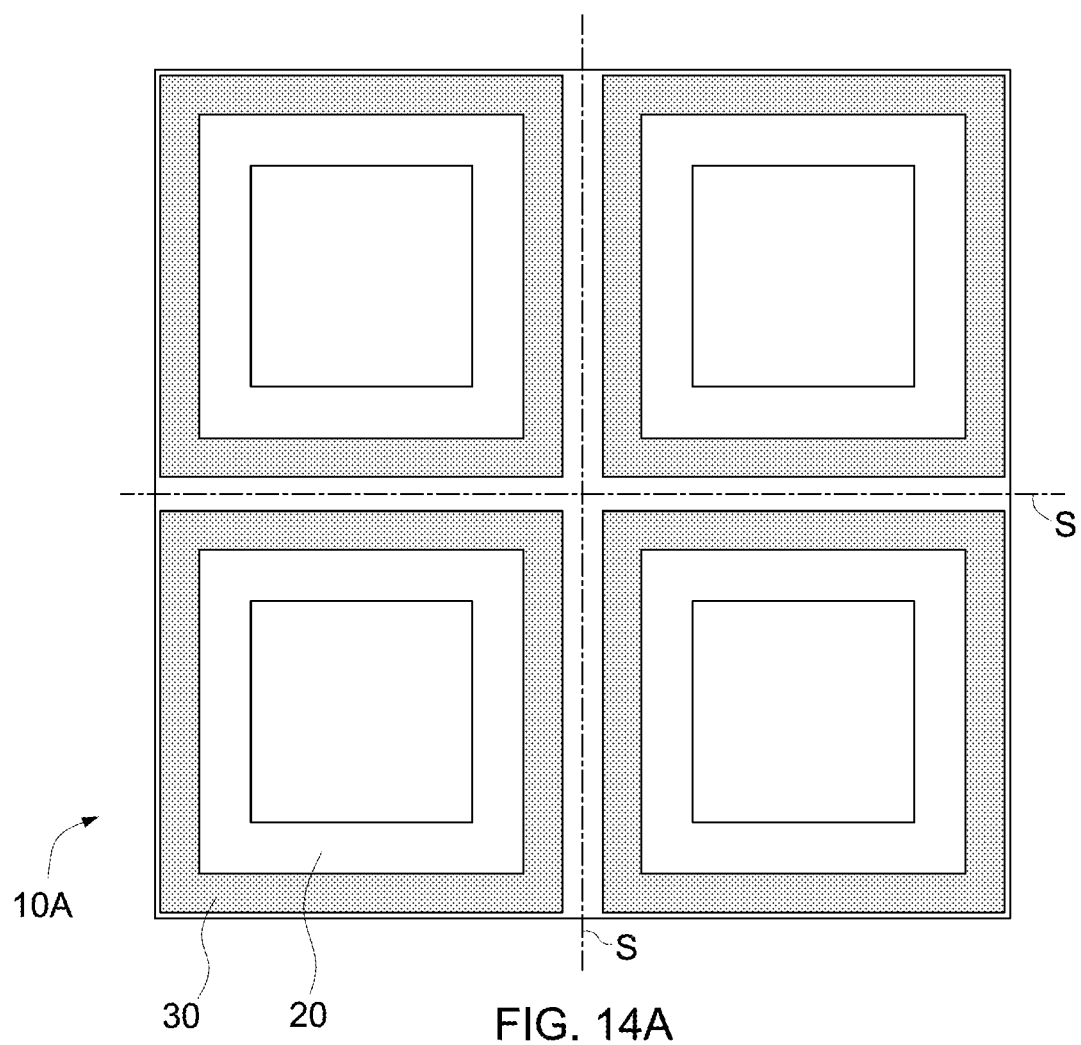

FIG. 12A, FIG. 12B, FIG. 13A, FIG. 13B, FIG. 14A, and FIG. 14B illustrate various operations in a method of manufacturing an optical package structure in accordance with some embodiments of the present disclosure. In some embodiments, FIG. 12A illustrates a top view of the structure shown in FIG. 12B, FIG. 13A illustrates a top view of the structure shown in FIG. 13B, and FIG. 14A illustrates a top view of the structure shown in FIG. 14B.

Referring to FIGS. 12A-12B, a structure 10A including a plurality of sensors 10 is provided. In some embodiments, the structure 10A includes a plurality of lens arrays 120 on surfaces 101 (also referred to as "upper surfaces 101") of the sensors 10. In some embodiments, the structure 10A is a wafer-level sensor structure.

Referring to FIGS. 13A-13B, an optical component 20 is bonded to a sensor 10. In some embodiments, the operation of bonding the optical component 20 to the sensor 10 may include: disposing a plurality of optical components 20 on a structure 10A including the sensors 10. In some embodiments, each of the optical components 20 is disposed on one of the sensors 10. In some embodiments, the optical component 20 directly contacts the sensor 10, and an interfacial area 100 is defined by a contacting region of the optical component 20 and the sensor 10.

In some embodiments, the optical component 20 is aligned to the sensor 10 by imaging an alignment mark on the sensor 10 outside of the interfacial area 100. In some embodiments, the optical component 20 is carried by a suction head, and the optical component 20 is moved to a predetermined location according to the alignment mark by the suction head. In some embodiments, the alignment mark may include physical structures including through holes located at inactive regions of the sensor (e.g., outside of the interfacial area 100), visual marks including patterns, or a combination thereof. The alignment mark may be imaged by an image sensor, for example, a charge-coupled device (CCD) from a side of the optical component 20, but the present disclosure is not limited thereto.

Figure 14B:
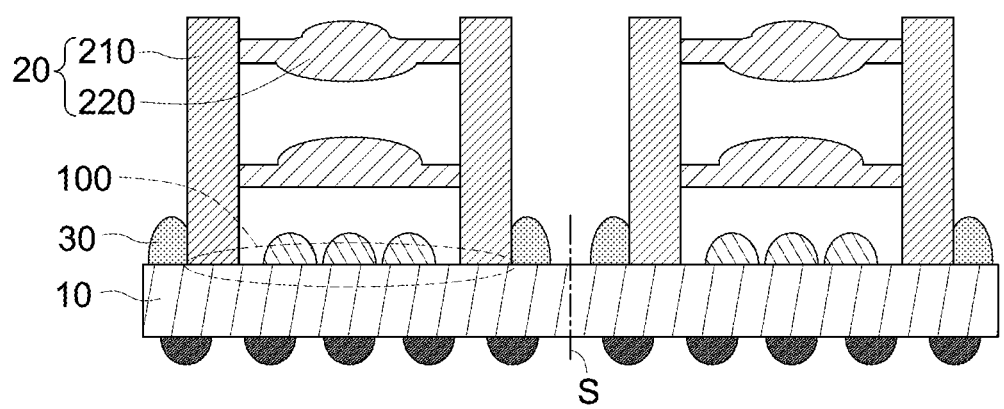

Referring to FIGS. 14A-14B, a fixing element 30 is disposed outside of the interfacial area 100 for bonding the optical component 20 and the sensor 10. In some embodiments, the operation of disposing the fixing element 30 may include the following steps: dispensing a gel outside of the interfacial area 100, and performing a curing operation on the gel. In some embodiments, the gel directly contacts the optical component 20 and the sensor 10. In some embodiments, the curing operation is performed under a temperature lower than about 150° C. In some embodiments, the curing operation is performed under a temperature equal to or lower than about 100° C. In some embodiments, the suction head is detached from the optical component 20 after the curing operation is completed.

In some embodiments, after the fixing element 30 is disposed to bond the sensor 10 and the optical component 20 together, a singulation operation is performed for separating the plurality of the sensors 10. In some embodiments, the structure 10A is cut along the scribe lines S to separate the sensors 10, so as to form the optical package structure 1 shown in FIG. 1.

Figure 15A:
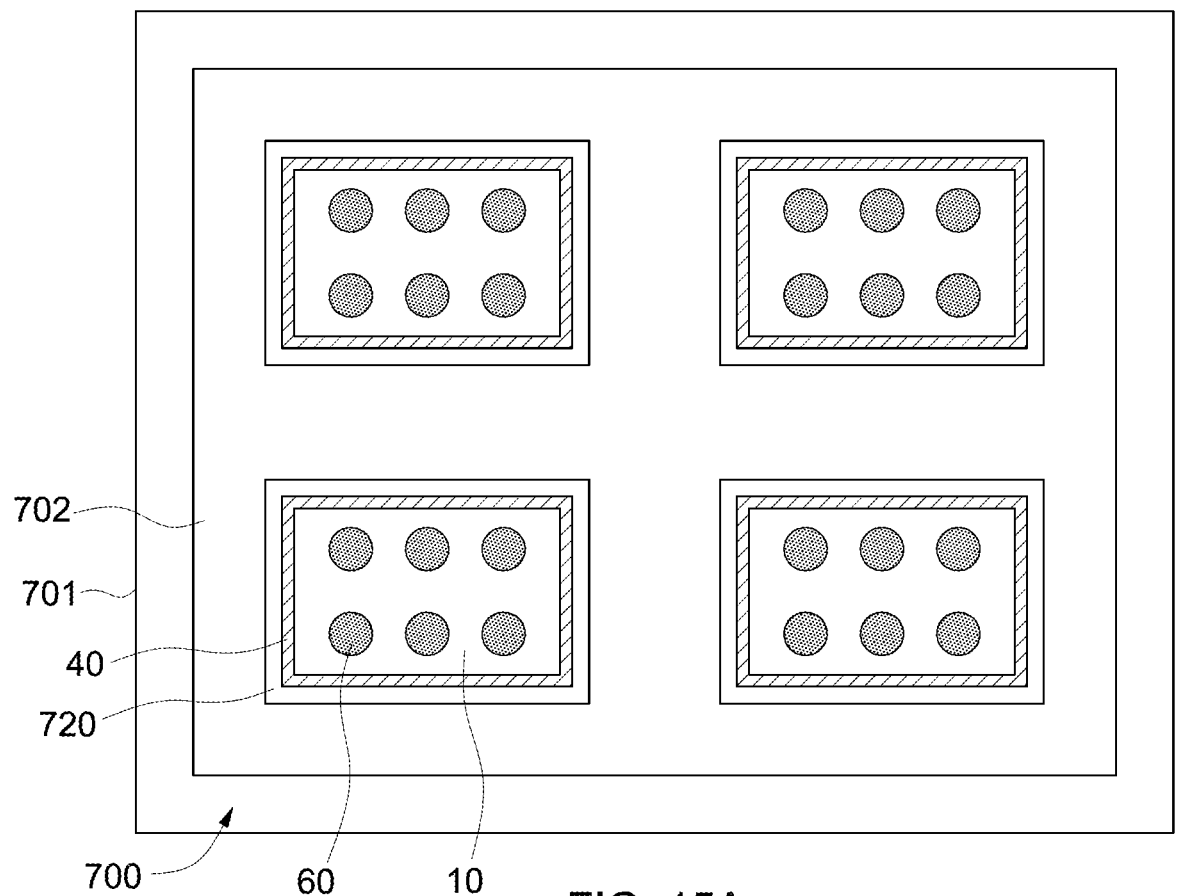
FIG. 15A, FIG. 15B, FIG. 16A and FIG. 16B illustrate various operations in a method of manufacturing an optical package structure in accordance with some embodiments of the present disclosure.
Figure 15B:
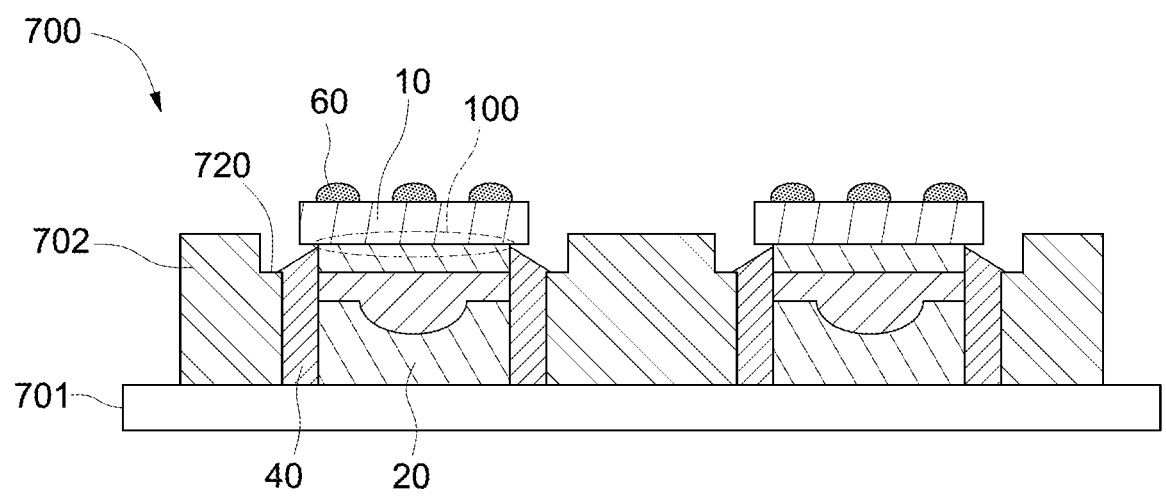
Figure 16A:
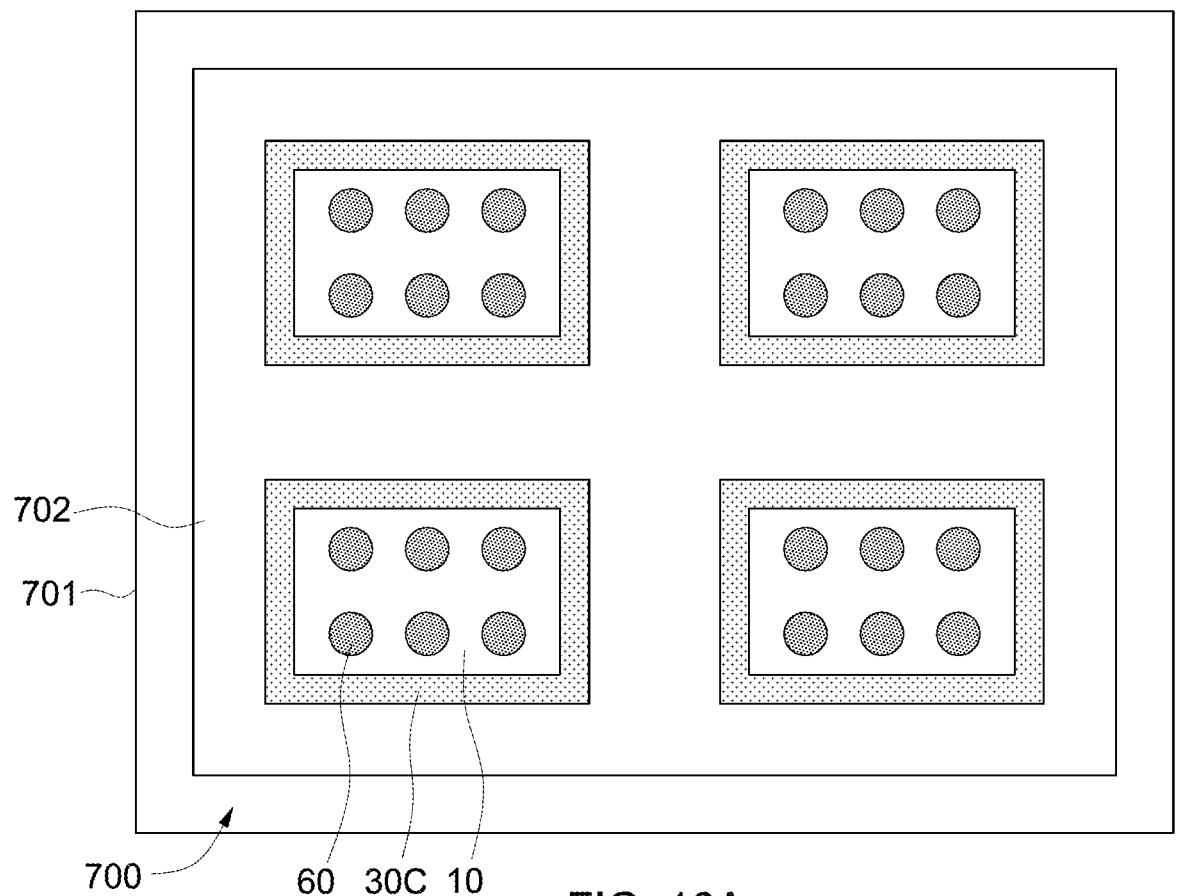

FIG. 15A, FIG. 15B, FIG. 16A and FIG. 16B illustrate various operations in a method of manufacturing an optical package structure in accordance with some embodiments of the present disclosure. In some embodiments, FIG. 15A illustrates a top view of the structure shown in FIG. 15B, and FIG. 16A illustrates a top view of the structure shown in FIG. 16B.

Referring to FIGS. 7A-7B, 8A-8B and 9A-9B, an outer casing 700 having at least a cavity 710 and a recessed portion 720 adjacent to the cavity 710 is placed on a support layer 701, optical components are disposed in the cavities 710, and a blocking layer 40 is formed in the trench 730 between the optical component 20 and the outer casing 700. In some embodiments, the as-formed blocking layer 40 surrounds the optical component 20.

In some embodiments, as previously described in FIG. 10B and FIG. 11B, operation of applying the second gel 30B may be performed after the operation of disposing the sensor 10 over the optical component 20. For example, a suction head may carry and abut the sensor 10 on the upper surface of the optical component 20. Subsequently, the second gel 30B may be applied at the recessed portion 720 as previously described in FIG. 10B. In some embodiments, the suction head bears a heat source which is suitable for performing a pre-cure operation on the second gel 30B that applied subsequently. After the suction head detaching from the sensor 10, a curing operation substantially identical to the second curing operation previously described can be performed to complete the fixation between the sensor 10 and the optical component 20. When the sensor 10 is placed over the optical component 20 prior to applying the second gel 30B, the risk of the second gel 30B bleeding into the interface of the sensor 10 and the optical component 20 can be better controlled. The operations pertaining to the aforesaid description are further depicted in FIG. 15A, FIG. 15B, FIG. 16A, and FIG. 16B.

Referring to FIGS. 15A-15B, sensors 10 are disposed on the optical component 20. In some embodiments, each of the sensors 10 is attached to a suction head, and each of the sensors 10 is disposed on a corresponding optical component 20 by the suction head. In some embodiments, the sensor 10 is aligned to the optical component 20 by imaging an alignment mark on the sensor 10 outside of the interfacial area 100 from the side of the support layer 701. The support layer 701 and the blocking layer 40 can be composed of material transparent to the wavelength of light emitting from the imaging device. In some embodiments, the operation of forming the blocking layer 40 surrounding the optical component is performed prior to disposing the sensor 10 on the optical component 20. In some embodiments, the operation of forming the blocking layer 40 surrounding the optical component is performed prior to bonding the optical component 20 to the sensor 10.

Figure 16B:
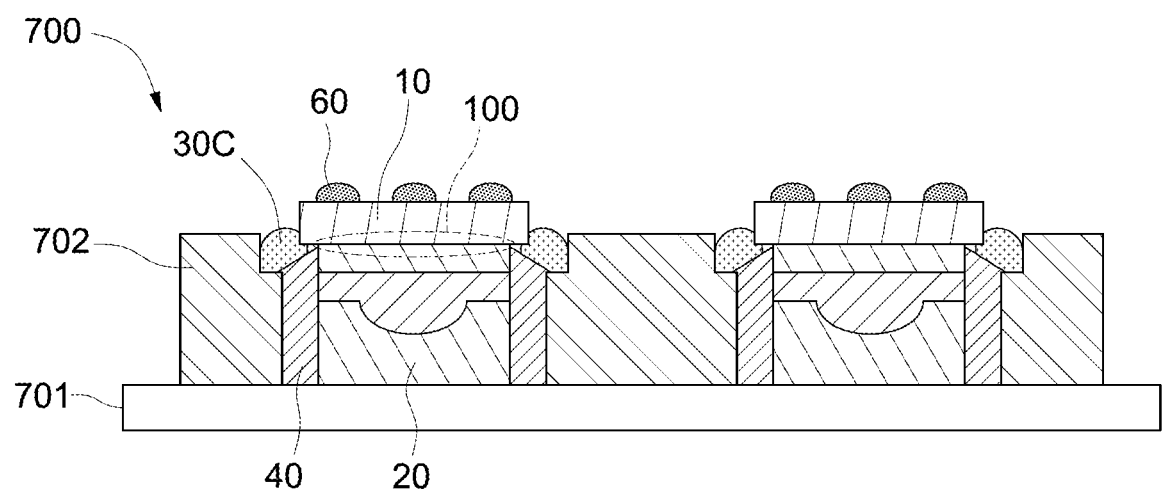

Next, referring to FIGS. 16A-16B, a fixing element 30 is disposed on the sensor 10 and outside of the interfacial area 100. In some embodiments, the operation of disposing the fixing element 30 may include the following steps: disposing a gel 30C on the sensor 10 and outside of the interfacial area 100, performing a curing operation (also referred to as "a pre-curing process") under a first temperature T1, and performing a curing operation under a second temperature T2 that is higher than the first temperature T1. In some embodiments, the first temperature T1 is equal to or lower than about 60° C., and the second temperature T2 is lower than about 150° C. In some embodiments, the second temperature T2 is equal to or lower than about 100° C.

In some embodiments, the suction head is detached from the optical component 20 after the curing operations are completed. In some embodiments, the curing operation (also referred to as "the pre-curing process") under the first temperature T1 may be performed through the suction head. According to some embodiments, the pre-curing process can cure the gel 30C to a certain level so as to preliminarily fix the sensor 10 at a relatively stable position corresponding to the optical component 20, which is advantageous to the alignment of the sensor 10 and the optical component 20. In some embodiments, the sensor 10 is aligned to the optical component 20 prior to performing the curing operation under the second temperature T2. In some embodiments, the curing operation under the second temperature T2 may include a baking process so as to fully cure the gel 30C to form the fixing element 30.

In some embodiments, after the sensor 10 and the optical component 20 are bonded together through the fixing element 30, a singulation operation is performed for separating adjacent cavities of the outer casing 700. In some embodiments, the support layer 701 is removed from the optical component 20. In some embodiments, the support layer 701 may be removed prior to or after performing the singulation operation. In some embodiments, please also refer to FIG. 5, the operation of performing the singulation operation includes removing a portion of the wall structure 702, so as to form the singulated optical package structure 5 shown in FIG. 5. In some embodiments, please also refer to FIG. 3 and/or FIG. 4, the operation of performing the singulation operation includes removing the wall structure 702 in its entirety, so as to form the singulated optical package structure 3 or 4 shown in FIG. 3 or FIG. 4.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of said numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and the like. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. An optical package structure, comprising:
    a sensor;
    an optical component directly contacting the sensor, an interfacial area being defined by a contacting region of the optical component and the sensor;
    a fixing element disposed outside of the interfacial area for bonding the optical component and the sensor; and
    a blocking layer surrounding the optical component, wherein the blocking layer is substantially opaque to a peak wavelength emitted or to be received by the sensor;
    wherein the optical component comprises a lens module and a housing surrounding the lens module, and the blocking layer directly contacts the housing; and
    wherein a lateral exposed portion of the lens module is exposed from the housing, and the blocking layer is in contact with the lateral exposed portion.

2. The optical package structure of claim 1, wherein the optical component comprises a first surface in contact with a sensing surface of the sensor.

3. The optical package structure of claim 1, wherein the fixing element is spaced apart from the optical component by a void.

4. The optical package structure of claim 3, wherein a portion of a lateral surface of the optical component is exposed to the void.

5. The optical package structure of claim 1, further comprising:
    an outer casing around the optical component, wherein an inner surface of the outer casing comprises a step profile proximate to the interfacial area, the step profile being configured to accommodate the fixing element, and the fixing element directly contacts the outer casing.

6. The optical package structure of claim 5, wherein the fixing element directly contacts the sensor and the step profile of the inner surface of the outer casing.

7. The optical package structure of claim 5, wherein the outer casing is composed of a material that is substantially opaque to the peak wavelength emitted or to be received by the sensor.

8. The optical package structure of claim 5, wherein the outer casing is around the blocking layer.

9. The optical package structure of claim 8, wherein the outer casing directly contacts the blocking layer.

10. The optical package structure of claim 1, wherein the fixing element directly contacts a first surface of the sensor.

11. The optical package structure of claim 1, wherein the fixing element is composed of a material that is substantially opaque to the peak wavelength emitted or to be received by the sensor.

12. The optical package structure of claim 1, further comprising:
   an outer casing surrounding the optical component, wherein an inner surface of the outer casing comprises a step profile proximate to the interfacial area, the step profile being configured to accommodate the fixing element.

13. The optical package structure of claim 1, wherein the sensor comprises a first surface contacting the fixing element and a second surface angled with the first surface, the optical component is disposed on the second surface of the sensor, and the fixing element directly contacts the second surface of the sensor.

14. The optical package structure of claim 1, wherein the fixing element is spaced apart from the optical component by the blocking layer.

15. The optical package structure of claim 14, wherein the blocking layer directly contacts the fixing element.

* * * * *